(12) United States Patent  
Jenkins et al.

(10) Patent No.: US 7,764,080 B2
(45) Date of Patent: *Jul. 27, 2010

(54) METHODS OF OPERATING AN ELECTRONIC CIRCUIT FOR MEASUREMENT OF TRANSISTOR VARIABILITY AND THE LIKE

(75) Inventors: Keith A. Jenkins, Sleepy Hollow, NY (US); Jae-Joon Kim, Yorktown Heights, NY (US); Rahul M. Rao, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/200,334

(22) Filed: Aug. 28, 2008

(65) Prior Publication Data

US 2008/0315907 A1  Dec. 25, 2008

Related U.S. Application Data

(63) Continuation of application No. 11/669,250, filed on Jan. 31, 2007, now Pat. No. 7,439,755.

(51) Int. Cl.
*G01R 31/26* (2006.01)

(52) U.S. Cl. .................................... 324/769
(58) Field of Classification Search .............. 324/769
See application file for complete search history.

(56) References Cited

U.S. PATENT DOCUMENTS 7,038,482 B1 * 5/2006 Bi ........................... 324/769

(Continued)

OTHER PUBLICATIONS

Mukhopadhyay, Saibal et al., 2007 IEEE International Solid-State Circuits Conference; ISSCC 2007/Session 22/Digital Circuit Innovations; "Statistical Characterization and On-Chip Measurement Methods for Local Random Variability of a Process Using Sense-Amplifier-Based Test Structure".

(Continued)

*Primary Examiner*—Ha Tran T Nguyen
*Assistant Examiner*—Shaun Campbell
(74) *Attorney, Agent, or Firm*—Ryan, Mason & Lewis, LLP

(57) ABSTRACT

An electronic circuit includes an output terminal and at least a first measuring FET. The second drain-source terminals of a plurality of FETS to be tested are interconnected with the first drain-source terminal of the first measuring FET and the output terminal. The second drain-source terminal of the first measuring FET is interconnected with a first biasing terminal. The first drain-source terminals of the FETS to be tested are interconnected with a second biasing terminal. A state machine is coupled to the gates of the FETS to be tested and the gate of the first measuring FET. The state machine is configured to energize the gate of the first measuring FET and to sequentially energize the gates of the FETS to be tested, so that an output voltage appears on the output terminal. Circuitry to compare the output voltage to a reference value is also provided. The gate of the first measuring field effect transistor is energized; the gates of the field effect transistors to be tested are sequentially energized, whereby an output voltage appears on the output terminal; and the output voltage is compared to the reference value.

14 Claims, 11 Drawing Sheets

U.S. PATENT DOCUMENTS

2005/0043908 A1* 2/2005 Bhavnagarwala et al. ..... 702/64

OTHER PUBLICATIONS

Terada, K. et al. "A Test Circuit for Measuring MOSFET Threshold Voltage Mismatch." Microelectronic Test Structures, 2003, International Conference, Mar. 2003, pp. 227-231.

Agarwal, K. et al. "A Test Structure for Characterizing Local Device Mismatches." Proceeding of Symposium on VLSI Circuits, pp. 67-68, 2006.

Drego, N. et al. "A Test-Structure to Efficiently Study Threshold-Voltage Variation in Large MOSFET Arrays." Microsystems Technology Laboratories, MIT, Cambridge, Ma, 2007.

* cited by examiner

METHODS OF OPERATING AN ELECTRONIC CIRCUIT FOR MEASUREMENT OF TRANSISTOR VARIABILITY AND THE LIKE

CROSS-REFERENCE TO RELATED APPLICATIONS

This application is a continuation, under 37 CFR 1.53(b), of co-assigned U.S. patent application Ser. No. 11/669,250 of inventors Jenkins et al., now U.S. Pat. No. 7,439,755, and claims the benefit thereof, said application Ser. No. 11/669,250 having been filed on Jan. 31, 2007, and entitled "Electronic Circuit For Measurement Of Transistor Variability And The Like." The complete disclosure of the aforesaid application Ser. No. 11/669,250 is expressly incorporated herein by reference in its entirety for all purposes.

STATEMENT REGARDING FEDERALLY SPONSORED RESEARCH OR DEVELOPMENT

Not applicable.

FIELD OF THE INVENTION

The present invention generally relates to electronic circuitry and, more particularly, to electronic circuits for measurement and the like.

BACKGROUND OF THE INVENTION

As the field effect transistors (FETs) in complementary metal-oxide semiconductor (CMOS) technology become smaller, there is an increasing possibility of undesired differences in the electrical characteristics of the FETs, or other devices, which are intended to be identical. This can occur due to uncontrollable fabrication biases, or due to randomness in the impurity implants which set threshold voltage. The variations can occur on various length scales, such as across the wafer variations, across the chip variations, or as variations between adjacent devices. Even under perfect processing conditions, the discrete nature of the impurity implants required to establish threshold voltage leads to random variations.

Such variations adversely affect the circuits which are formed from the devices. The most commonly cited example is that of static random access memory (SRAM), which is subject to significant yield loss as threshold variations become large. Analog circuits, such as current mirrors, become inaccurate if devices are not identical. Similarly, critically timed digital circuits may be prone to timing error if the devices are not all identical.

Thus as semiconductor processing technology continues to result in FETs of smaller and smaller dimensions, there is an increasing need to monitor device variations, particularly for very small, very closely spaced individual devices. Presently, device variations are measured by using external test equipment, measuring suitable current-voltage (I-V) curves of individual devices, and analyzing the results afterwards. This is not only time consuming; it also consumes a good deal of silicon area per device, since the probe pads for this method are much greater in area than are the devices being tested.

Other methods of assessing the device variability have been proposed, such as ring oscillators, which measure the average threshold voltage of a number of devices, and memory operation, which measures the threshold variation of 4 or 6 devices.

It would be desirable to overcome one or more of the limitations in previous approaches.

SUMMARY OF THE INVENTION

Principles of the present invention provide techniques for electronic circuits for measurement of transistor variability and the like. In an exemplary embodiment, according to one aspect of the invention, an electronic circuit includes an output terminal (Vout) and a plurality of FETS to be tested. The FETS have first drain-source terminals, gates, and second drain-source terminals. Also included is at least a first measuring FET (which can also be referred to as a load FET) having a first drain-source terminal, a gate, and a second drain-source terminal. The second drain-source terminals of the plurality of FETS to be tested are interconnected with the first drain-source terminal of the first measuring FET and the output terminal.

The exemplary circuit further includes a first biasing terminal. The second drain-source terminal of the first measuring FET is interconnected with the first biasing terminal. A second biasing terminal is also included. The first drain-source terminals of the FETS to be tested are interconnected with the second biasing terminal. A state machine is coupled to the gates of the FETS to be tested and the gate of the first measuring FET. The state machine is configured to energize the gate of the first measuring FET and to sequentially energize the gates of the FETS to be tested, whereby an output voltage appears on the output terminal. Circuitry to compare the output voltage to a reference value is also provided; this may be a count comparison rather than a voltage reading per se.

One or more embodiments of the present invention may be realized in the form of an integrated circuit.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Initially, it should be noted that for purposes of describing the invention, the variation among devices will be expressed in terms of threshold voltage variation; however, inventive techniques are applicable to detecting a wide variety of variations between devices resulting from processing factors and the like.

One or more inventive embodiments are capable of achieving one or more of the following benefits: measuring the difference in electrical device behavior of single devices (NFET or PFET), which may be as small as the technology permits; making the measurement entirely on-chip; obtaining the results as digital data; measuring rapidly; and measuring variations of a very large number of devices with very little silicon area devoted to probe pads. One or more inventive embodiments can be used to measure local or across-chip device variations, whether caused by random fluctuations or systematic effects.

The basic method to measure device variability is to stack two FETs between the power and ground terminals of a circuit. In this configuration, the voltage at the connection of the source of the upper device to the drain of the lower device is a function of the widths of the two devices and their drain currents. The drain currents of identical devices should be the same; line width variations or threshold voltage variations will change this voltage. By using a plurality of upper devices and a single lower device, and selectively activating only one upper device at a time, the voltage will reflect variations of the characteristics of the upper devices.

Figure 1:
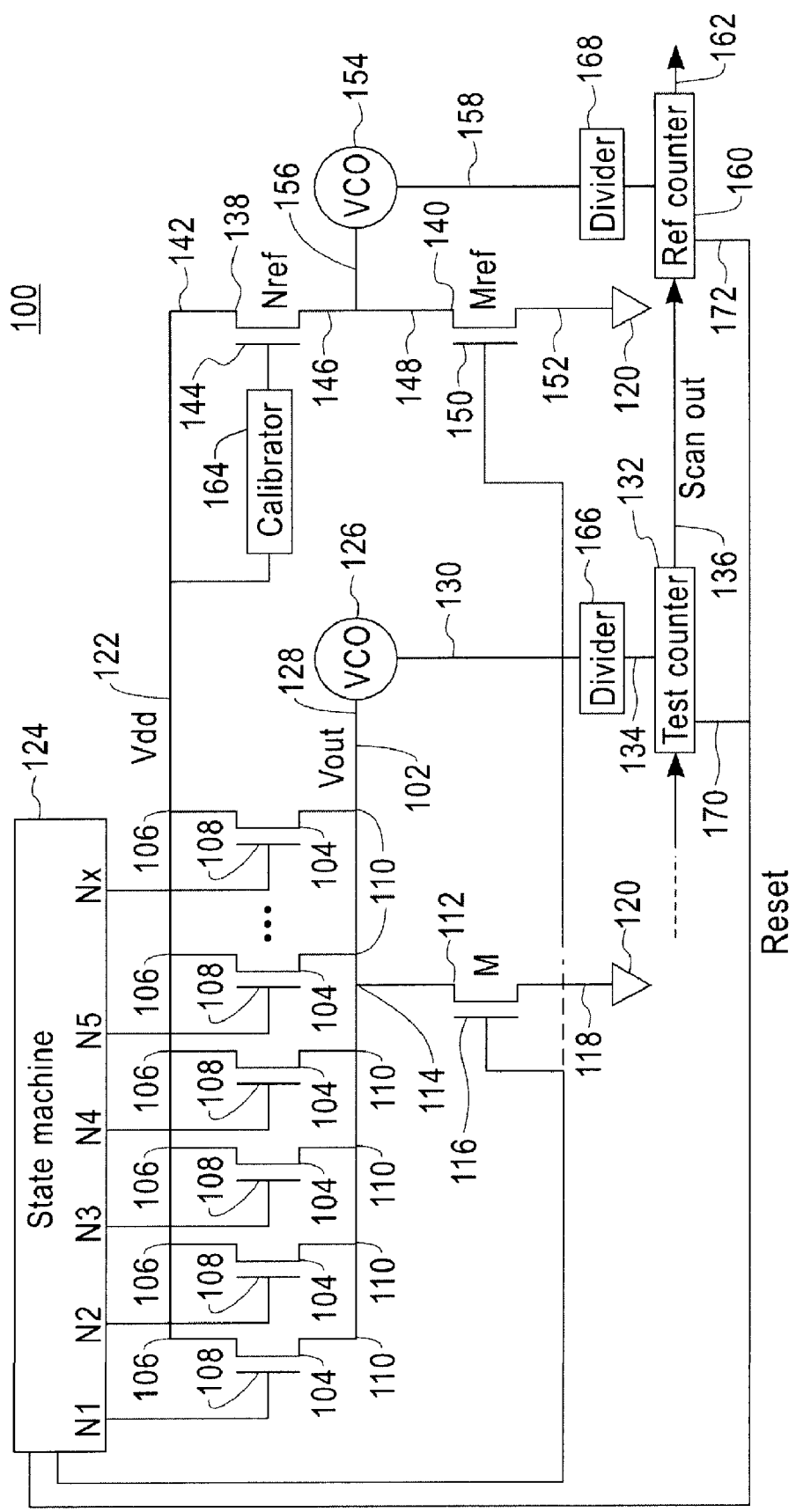
FIG. 1 shows an exemplary embodiment of a circuit according to an aspect of the invention.

Reference should now be had to FIG. 1, which depicts an exemplary embodiment of an inventive circuit 100. The circuit 100 is described entirely in terms of NFET measurement, but by suitable changes, discussed below, can be readily adapted to PFET measurement.

Circuit 100 includes an output terminal 102 (Vout), and a plurality of field effect transistors (FETS) 104 to be tested. The FETS (N1 through Nx) have first drain-source terminals 106, gates 108, and second drain-source terminals 110. At least a first measuring FET M, numbered as 112, has a first drain-source terminal 114, a gate 116, and a second drain-source terminal 118. The second drain-source terminals 110 of the plurality of FETS 104 to be tested are interconnected with the first drain-source terminal 114 of the first measuring FET 112 and the output terminal 102.

The second drain-source terminal 118 of the first measuring FET 112 is interconnected with a first biasing terminal 120. The first drain-source terminals 106 of the FETS 104 to be tested are interconnected with a second biasing terminal 122. A state machine 124 is coupled to the gates 108 of the FETS 104 to be tested and the gate 116 of the first measuring FET 112. The state machine 124 is configured to energize the gate 116 of the first measuring FET 112 and to sequentially energize the gates 108 of the FETS 104 to be tested, such that an output voltage appears on the output terminal 102. Circuitry is provided to compare the output voltage to a reference value (this may be a count comparison rather than a voltage reading per se.) Further discussion of such circuitry is provided below.

In one or more embodiments, the state machine 124 is configured to supply a variable gate voltage to the first measuring FET 112, so as to operate a given one of the FETS 104 to be tested at a measuring point wherein the given one of the FETS 104 is operating, at a given time, in a desired one of a linear region and a saturation region. The linear region and saturation region are distinct, which is why some embodiments (discussed below) have two measuring transistors in the lower branch, or a voltage controlled measuring resistor as in FIG. 1. The linear region occurs approximately when the drain to source voltage of the test device is lower than the gate to source voltage minus threshold voltage, and saturation occurs approximately when the drain to source voltage of the device is equal to or higher than the gate to source voltage minus threshold voltage. The two measuring devices (see discussion below with regard to FIG. 2) change the voltage at the test device source terminal to operate it in these two regimes. A single device 112 can be used, instead, since by changing its gate voltage, its current, and therefore the voltage at Vout, we can put the test device into either regime. Thus, single measuring device embodiments, such as, for example, FIG. 1, and two-device embodiments, such as, for example, FIG. 2, can achieve measurement in the linear and/or saturation regime, as desired. In addition, one could use more than two measuring FETS for some intermediate regime. It should also be noted at this point that when we switch between the M (FIGS. 2, 4, and 5) or Q (FIGS. 7, 9, and 10) transistors, we change the source voltage of the test device. This changes the operating range of the test FET. To switch between linear and saturation, one should also appropriately adjust the gate to drain voltage, via appropriate adjustments to the gate voltage or Vdd.

In one or more embodiments, the FETS 104 to be tested are nominally identical. The circuit 100 (and other embodiments) is typically formed as an integrated circuit, as will be discussed below.

In the example of FIG. 1, the circuitry to compare the output voltage to a reference value includes a voltage controlled oscillator (VCO) 126, with a control terminal 128 interconnected with the output terminal 102. The VCO 126 has an output 130. A test counter 132 has an input terminal 134 coupled to the output 130 of the VCO 126. The test counter 132 has an output terminal 136. Given the teachings herein, the skilled artisan will appreciate that the counter output can be sent off-chip via otherwise conventional scan circuitry.

In the specific example of FIG. 1, the single measuring transistor, M, numbered 112, has a gate connected to the gate of reference transistor Mref, to be discussed below, and thus these two devices have the same gate voltage. This gate voltage will be set by the state machine 124. The state machine 124 can be configured to supply a variable gate voltage to the first measuring FET 112, so as to operate a given one of the FETS 104 to be tested at a measuring point wherein the given one of the FETS 104 is operating, at a given time, in a desired one of a linear region and a saturation region. The VCO 126 comprises a first VCO, and the circuitry to compare the output voltage to the reference value further comprises additional elements to be described at this point. First (Nref) and second (Mref) fixed reference FETS 138, 140, each have a first drain-source terminal 142, 148, a gate 144, 150, and a second drain-source terminal 146, 152. The second drain-source terminal 146 of the first fixed reference FET 138 is connected to the first drain-source terminal 148 of the second fixed reference FET 140, and the gate 144 of the first fixed reference FET 138 is coupled to the second biasing terminal 122 (in the example shown in FIG. 1, through calibrator 164 discussed elsewhere herein). The gate 150 of the second fixed reference FET 140 is coupled to the gate 116 of the first measuring FET 112, and the first drain-source terminal 142 of the first fixed reference FET 138 is coupled to the second biasing terminal 122. The second drain-source terminal 152 of the second fixed reference FET 140 is coupled to the first biasing terminal 120;

A second VCO 154 has a control terminal 156 interconnected with the second drain-source terminal 146 of the first fixed reference FET 138 and the first drain-source terminal 148 of the second fixed reference FET 140. The second VCO 154 has an output 158. A reference counter 160 is coupled to the output 158 of the second VCO 154, the reference counter 160 having an output terminal 162. The arrows entering the left-hand side of the counters 132, 162 represent the test scan input-output path. VCOs 126, 154 can each be connected to the corresponding counter 132, 160 through a divider 166, 168. A reset signal port 170, 172 can be provided for counters 132, 160 respectively to receive a reset signal from state machine 124. Calibrator 164 can be provided, with the gate 144 of the first fixed reference FET 138 being coupled to the second biasing terminal 122 through the calibrator 164.

Figure 2:
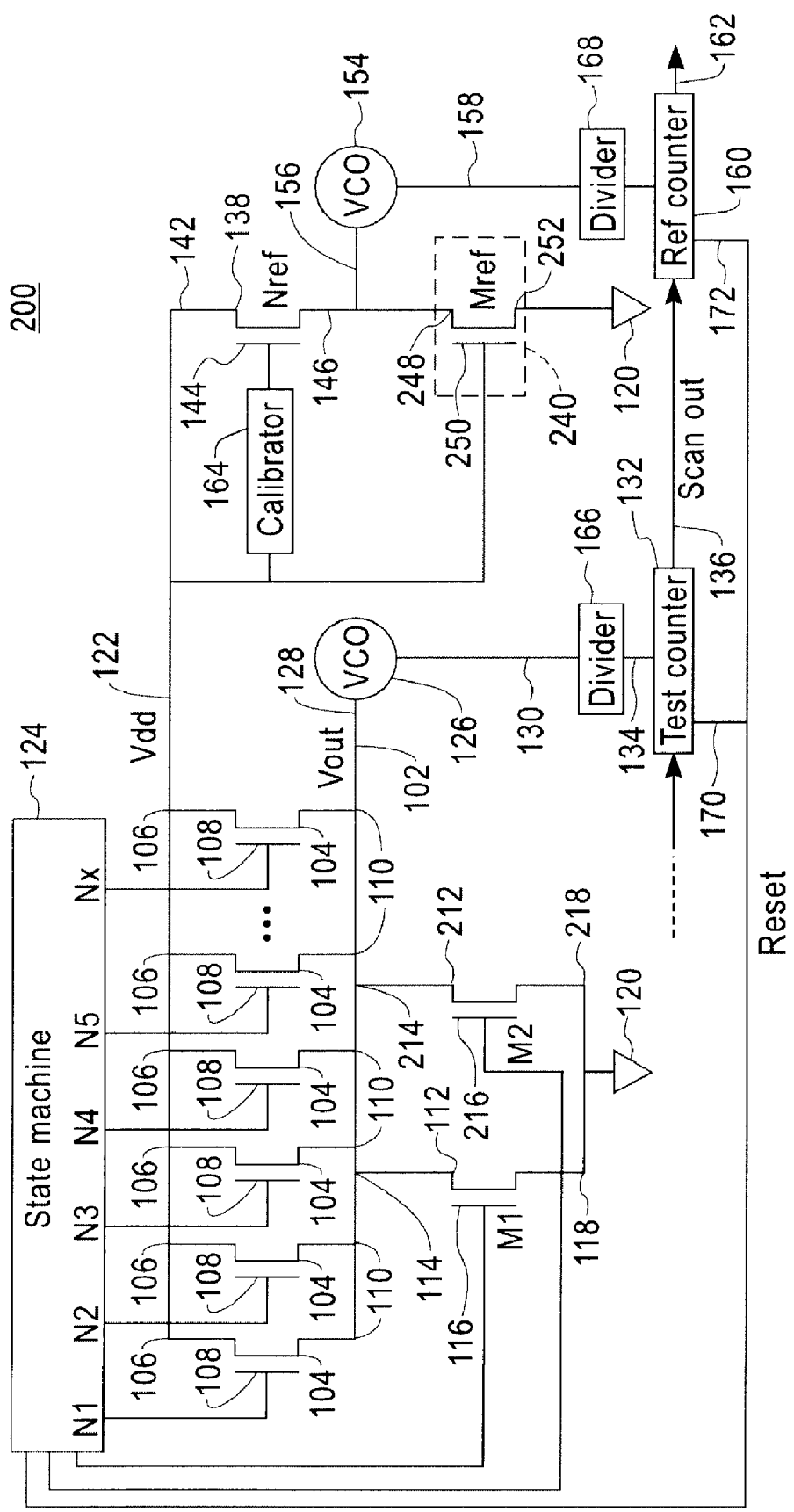
FIG. 2 shows an exemplary embodiment of a circuit according to another aspect of the invention.

Attention should now be given to FIG. 2 for a description of circuit embodiment 200. Elements in FIG. 2 similar to those in FIG. 1 have received the same reference character and to the extent such elements are not described again with respect to FIG. 2, reference should be had to the FIG. 1 description. In the exemplary embodiment of FIG. 2, a second measuring FET 212 is provided, having a first drain-source terminal 214, a gate 216, and a second drain-source terminal 218. The first drain-source terminal 214 of the second measuring FET 212 is interconnected with the first drain-source terminal 114 of the first measuring FET 112, and the second drain-source terminal 218 of the second measuring FET 212 is interconnected with the first biasing terminal 120. The gate 216 of the second measuring FET 212 is interconnected with the state machine 124. The first and second measuring FETS 112, 212 each have a width, with the widths being selected so as to operate a given one of the FETS 104 to be tested at a measuring point wherein the given one of the FETS 104 is operating, at a given time, in a desired one of a linear region and a saturation region. The state machine could energize the gate of one or both transistors M1 and M2 to get one to a desired operating region.

Figure 3:
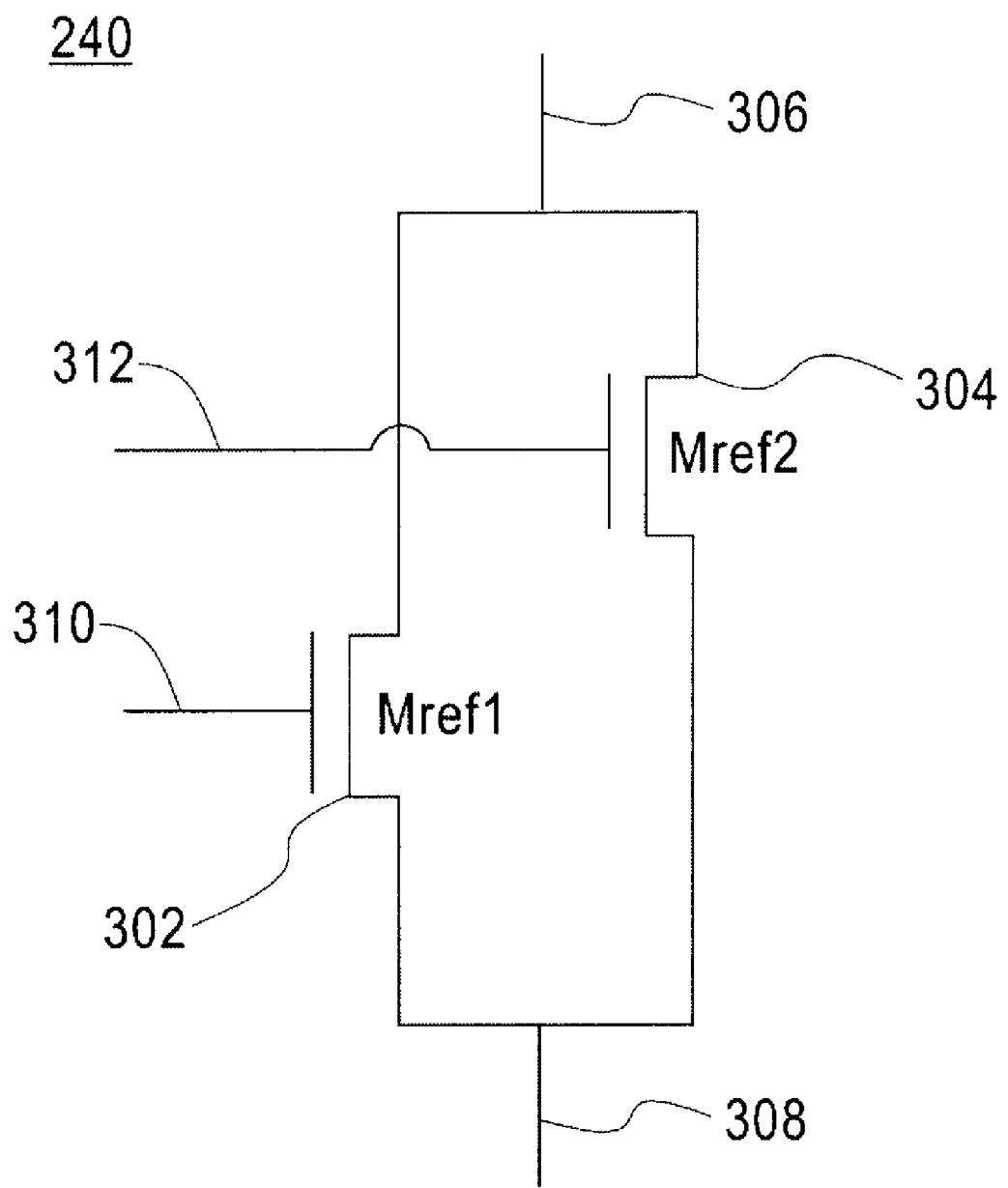
FIG. 3 shows an inventive block with reference n-type FETs (NFETs)

Still referring to FIG. 2, the VCO 126 comprises a first VCO; and the circuitry to compare the output voltage to the reference value further comprises additional elements to be described at this point. A first (Nref) fixed reference FET 138 has a first drain-source terminal 142, a gate 144, and a second drain-source terminal 146, and a second (Mref) fixed reference FET block 240, has a first drain-source terminal 248, a gate terminal 250, and a second drain-source terminal 252. A "FET block" is intended to refer to one or more appropriately configured FETs and will be described further below. A FET block has a gate terminal and first and second drain-source terminals; in the case of a single FET, these terminals are simply the gate and the first and second drain-source terminals of the single transistor; in the case, say, of a two-transistor block, as shown in FIG. 3, the first and second drain-source terminals represent the (interconnected) first and second drain source terminals of the two transistors, while the gate terminal represents a selective connection to one or the other (or both) gates of the two transistors.

The second drain-source terminal 146 of the first fixed reference FET 138 is connected to the first drain-source terminal 248 of the second fixed reference FET block 240. The gate 144 of the first fixed reference FET 138 and the gate terminal 250 of the second fixed reference FET block 240 are coupled to the second biasing terminal 122 (in the example shown in FIG. 2, gate 144 is coupled to terminal 122 through calibrator 164 discussed elsewhere herein, while gate terminal 250 is coupled directly to terminal 122). The first drain-source terminal 142 of the first fixed reference FET 138 is coupled to the second biasing terminal 122. The second drain-source terminal 252 of the second fixed reference FET block 240 is coupled to the first biasing terminal 120.

Second VCO 154 has a control terminal 156 interconnected with the second drain-source terminal 146 of the first fixed reference FET 138 and the first drain-source terminal 248 of the second fixed reference FET block 240, with the second VCO 154 having an output 158. A reference counter 160 is coupled to the output 158 of the second VCO 154, with the reference counter 160 having an output terminal 162. Calibrator 164 can be provided, with the gate 144 of the first fixed reference FET 138 being coupled to the second biasing terminal 122 through the calibrator 164.

By way of review, an array of identically designed FETs, N1 to Nx, is connected, as shown, to the drain terminals of two additional nFETs, M1 and M2. The drains of N1 to Nx are connected to Vdd, and the sources of M1 and M2 are connected to ground. A state machine 124 governs the operation of the test. The state machine selectively applies Vdd to the gate of either M1 or M2 (or both). The widths of M1 and M2 are designed to operate N1 to Nx in the linear or saturation regime, as desired. Alternately, as in FIG. 1, one can use a single M transistor, with a variable gate voltage, to set the measurement point. The state machine applies Vdd to the gates of N1 to Nx successively.

As Vdd is applied to one of the N transistors, a voltage occurs at the node, Vout, in accordance to the electrical properties of the two transistors. The voltage Vout is applied to the control terminal of a voltage controlled oscillator (VCO) 126 which acts to convert the voltage to a frequency. At the same time, shown on the right hand side of FIGS. 1 and 2, is a reference circuit comprising two fixed FETs, Nref and Mref (a "FET block" in the case of FIG. 2), similar to those in the test circuit. The midpoint voltage similarly controls a VCO 154. The outputs of the VCOs are divided to lower frequencies, if necessary, and connected to digital counters 132, 160. The second VCO acts as a constant reference time base against which to compare the frequency of the test VCO 126. The ratio of the number of counts obtained in a given time interval is thereby a measure of the ratio in the frequencies of the VCOs. The acquired values in the counters can be sent off-chip by conventional scan circuitry. The use of a reference branch also reduces or eliminates any concerns about voltage or temperature variations, since both the devices being tested and the reference will be subject to the same conditions.

Measuring the ratio of test counts to reference counts according to the Nth transistor (that transistor which is selected) thereby gives a numerical representation of the output current characteristic of the Nth transistor compared to the unchanged M transistor(s). Since only ratios of the counts are used, one or more embodiments of test circuits have no analog features and require no off-chip instruments or controls. The state machine 124 governs the selection of the desired one of the N transistors and the timing window, readout and reset of the counters. In the implementation of the circuit shown in FIGS. 1 and 2, the counters are enabled for a determined amount of time, and after that time has elapsed, the result in each counter can be compared. The counters are then cleared, a different one of the N transistors is selected, and the frequency measurement is repeated.

Turning now to FIG. 3, a specific example of FET block 240 is provided. The FETs Mref1 and Mref2, numbered 302 and 304, have common sources 306 and drains 308, and only the gates 310, 312 have to be selected to pick one or the other (or both) for calibration, just as with regard to devices 112, 212. Mref1 or Mref2 or both are selected to be the same as M1 or M2 or both (in the case where both are selected).

Figure 4:
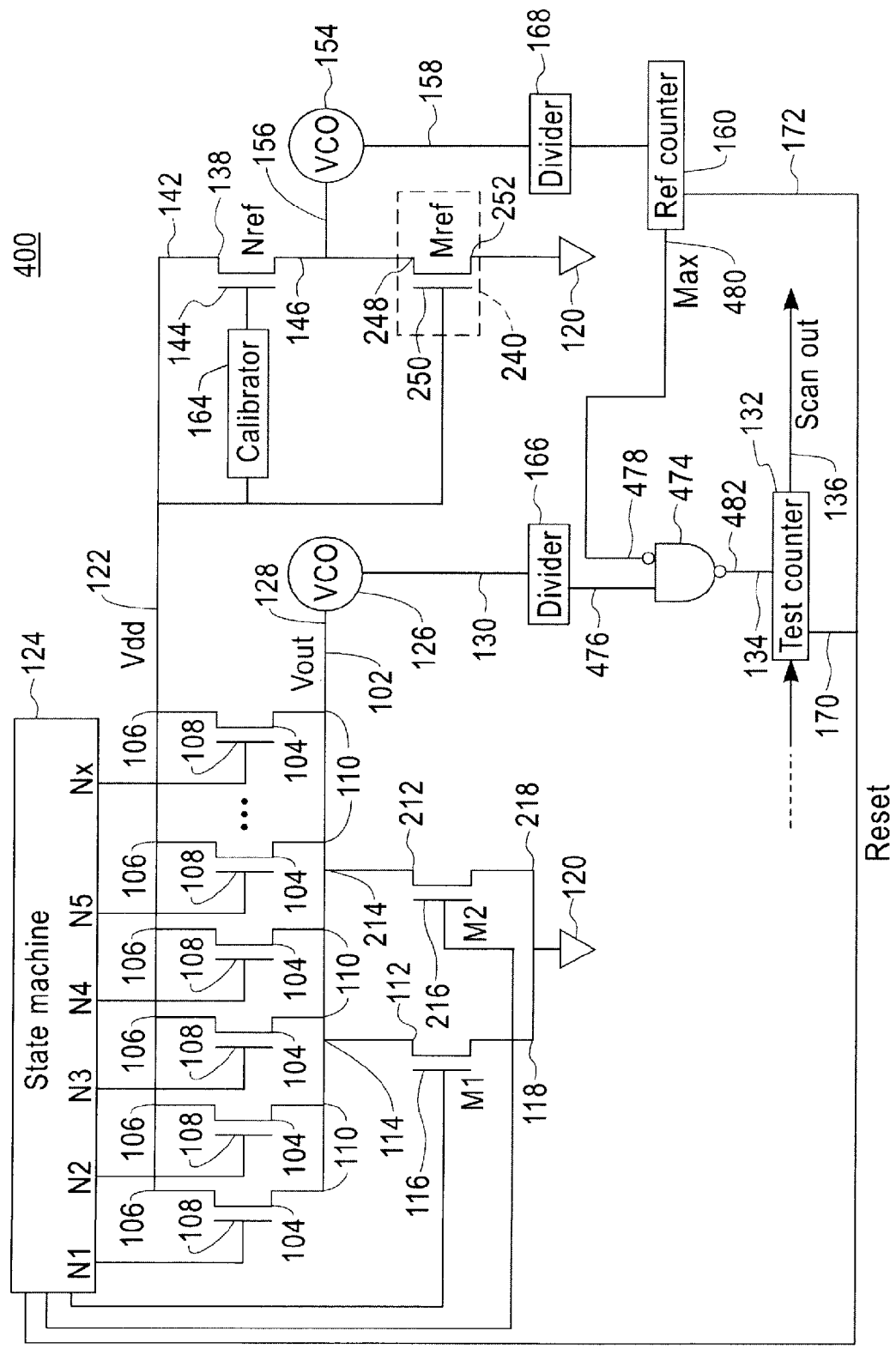
FIG. 4 shows an exemplary embodiment of a circuit according to yet another aspect of the invention.

With attention now to FIG. 4, in the exemplary embodiment 400 therein, the test counter 132 is enabled until the reference counter 160 reaches its maximum count. This eliminates the need for a precise timing generator and the need to scan out the contents of the reference counter. Elements similar to those already described have received the same reference characters and reference should be had to the descriptions above. Second measuring FET 212 has a first drain-source terminal 214, a gate 216, and a second drain-source terminal 218. The first drain-source terminal 214 of the second measuring FET 212 is interconnected with the first drain-source terminal 114 of the first measuring FET 112. The second drain-source terminal 218 of the second measuring FET 212 is interconnected with the first biasing terminal 120. The gate 216 of the second measuring FET 212 is interconnected with the state machine 124, and the first and second measuring FETS 112, 212 each have a width, with the widths being selected so as to operate a given one of the FETS 104 to be tested at a measuring point wherein the given one of the FETS 104 is operating, at a given time, in a desired one of a linear region and a saturation region. VCO 126 comprises a first VCO, and the circuitry to compare the output voltage to the reference value further comprises elements to be discussed at this point.

A first (Nref) fixed reference FET 138 has a first drain-source terminal 142, a gate 144, and a second drain-source terminal 146, and a second (Mref) fixed reference FET block 240 has a first drain-source terminal 248, a gate terminal 250, and a second drain-source terminal 252, with the second drain-source terminal 146 of the first fixed reference FET 138 being connected to the first drain-source terminal 248 of the second fixed reference FET block 240. The gate 144 of the first fixed reference FET 138 and the gate terminal 250 of the second fixed reference FET block 240 are coupled to the second biasing terminal 122 (in the example shown in FIG. 4, gate 144 is coupled to terminal 122 through calibrator 164 discussed elsewhere herein, while gate terminal 250 is coupled directly to terminal 122). The first drain-source terminal 142 of the first fixed reference FET 138 is coupled to the second biasing terminal 122, and the second drain-source terminal 252 of the second fixed reference FET block 240 is coupled to the first biasing terminal 120. Second VCO 154 has a control terminal 156 interconnected with the second drain-source terminal 146 of the first fixed reference FET 138 and the first drain-source terminal 248 of the second fixed reference FET block 240, and has an output 158. Reference counter 160 is coupled to the output 158 of the second VCO 154, with the reference counter 160 having a MAX output 480 outputting a predetermined logic level upon the reference counter 160 reaching a maximum count. A suitable logic gate 474 has a first input 476 coupled to the output 130 of the first VCO 126 and a second input 478 coupled to the MAX output 480 of the reference counter 160. The logic gate 474 has an output 482 coupled to the input 134 of the test counter 132, with the logic gate 474 being configured to enable the test counter 132 until the reference counter 160 reaches the maximum count. First and second dividers 166, 168 can be provided, with the output 130 of the first VCO 126 connected to the first input 476 of the logic gate 474 through the first divider 166 and the output 158 of the second VCO 154 connected to the reference counter 160 through the second divider 168.

Figure 5:
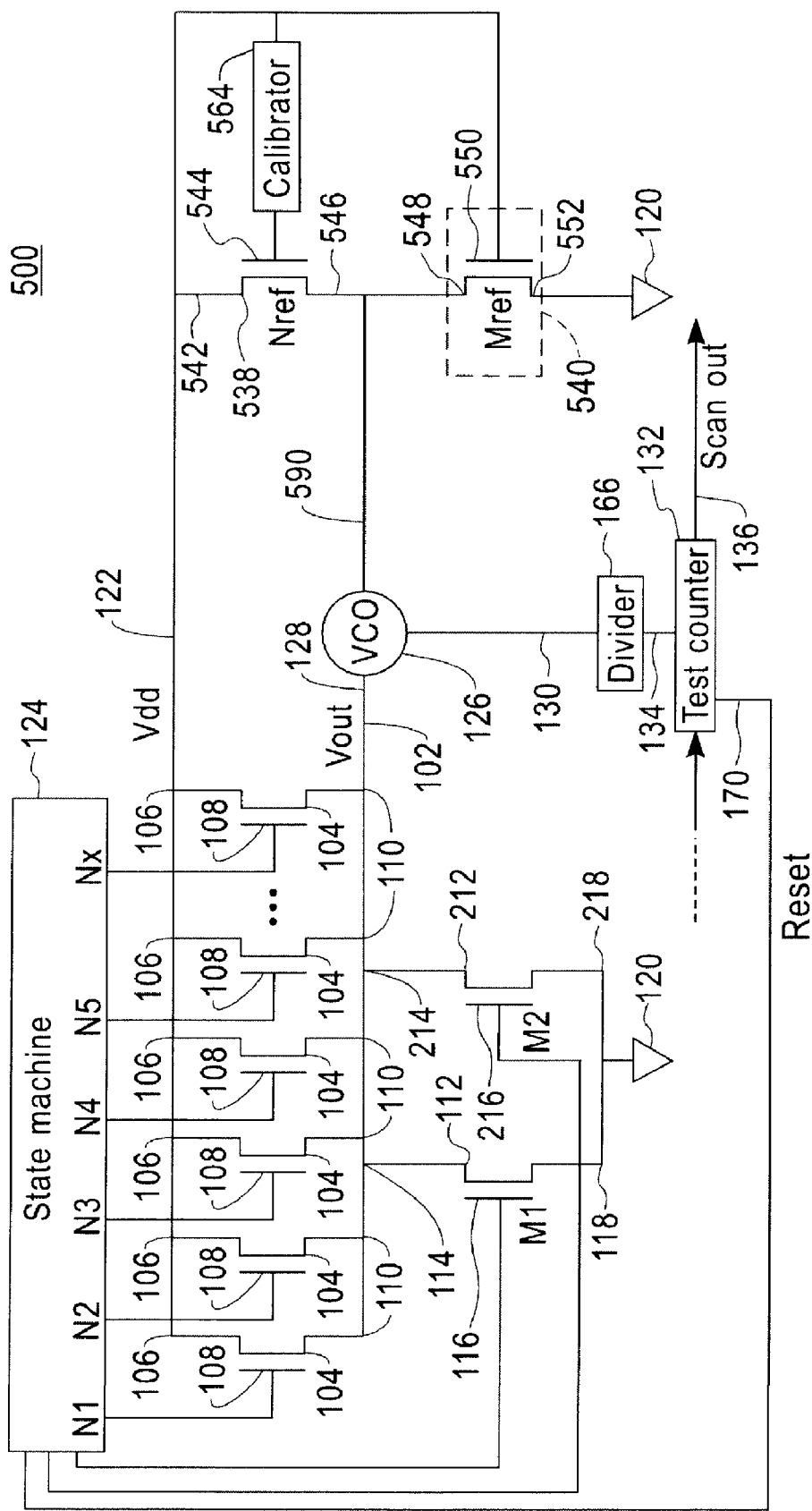
FIG. 5 shows an exemplary embodiment of a circuit according to a further aspect of the invention.

In another alternative embodiment 500, shown in FIG. 5, the VCO 126 is differential, that is, it is controlled by a voltage difference between terminals 128 and 590. One of the two differential signals 590 comes from the reference circuit, while the other 128 comes from the test devices. This implementation eliminates the second frequency counter. Again, elements previously described have received the same reference character and attention should be given to the descriptions above. Second measuring FET 212 has a first drain-source terminal 214, a gate 216, and a second drain-source terminal 218, with the first drain-source terminal 214 of the second measuring FET 212 being interconnected with the first drain-source terminal 114 of the first measuring FET 112, the second drain-source terminal 218 of the second measuring FET 212 being interconnected with the first biasing terminal 120, the gate 216 of the second measuring FET 212 being interconnected with the state machine 124, and the first and second measuring FETS 112, 212 each having a width. The widths are selected so as to operate a given one of the FETS 104 to be tested at a measuring point wherein the given one of the FETS 104 is operating, at a given time, in a desired one of a linear region and a saturation region.

The VCO 126 comprises a differential VCO. The control terminal 102 of the VCO 126 comprises a first differential control terminal, with the VCO further comprising a second differential control terminal 590. The circuitry to compare the output voltage to the reference value further comprises additional elements to be described at this point. A first (Nref) fixed reference FET 538 has a first drain-source terminal 542, a gate 544, and a second drain-source terminal 546, and a second (Mref) fixed reference FET block 540 has a first drain-source terminal 548, a gate terminal 550, and a second drain-source terminal 552. The second drain-source terminal 546 of the first fixed reference FET 538 is connected to the first drain-source terminal 548 of the second fixed reference FET block 540, and the gate 544 of the first fixed reference FET 538 and the gate terminal 550 of the second fixed reference FET block 540 are coupled to the second biasing terminal 122 (in the example shown in FIG. 5, gate 544 is coupled to terminal 122 through calibrator 564 while terminal 550 is coupled directly to terminal 122). The first drain-source terminal 542 of the first fixed reference FET 538 is coupled to the second biasing terminal 122, and the second drain-source terminal 552 of the second fixed reference FET block 540 is coupled to the first biasing terminal 120. FET block 540 can be constructed using techniques similar to those discussed with regard to FIG. 3. Test counter 132 is coupled to the output 130 of the VCO 126, with the test counter 132 having an output terminal 136.

Calibrator 564 can be included, with the gate 544 of the first fixed reference FET 538 being coupled to the second biasing terminal 122 through the calibrator 564. Output 130 of the VCO 126 is connected to the test counter 132 through the divider 166.

Figure 6:
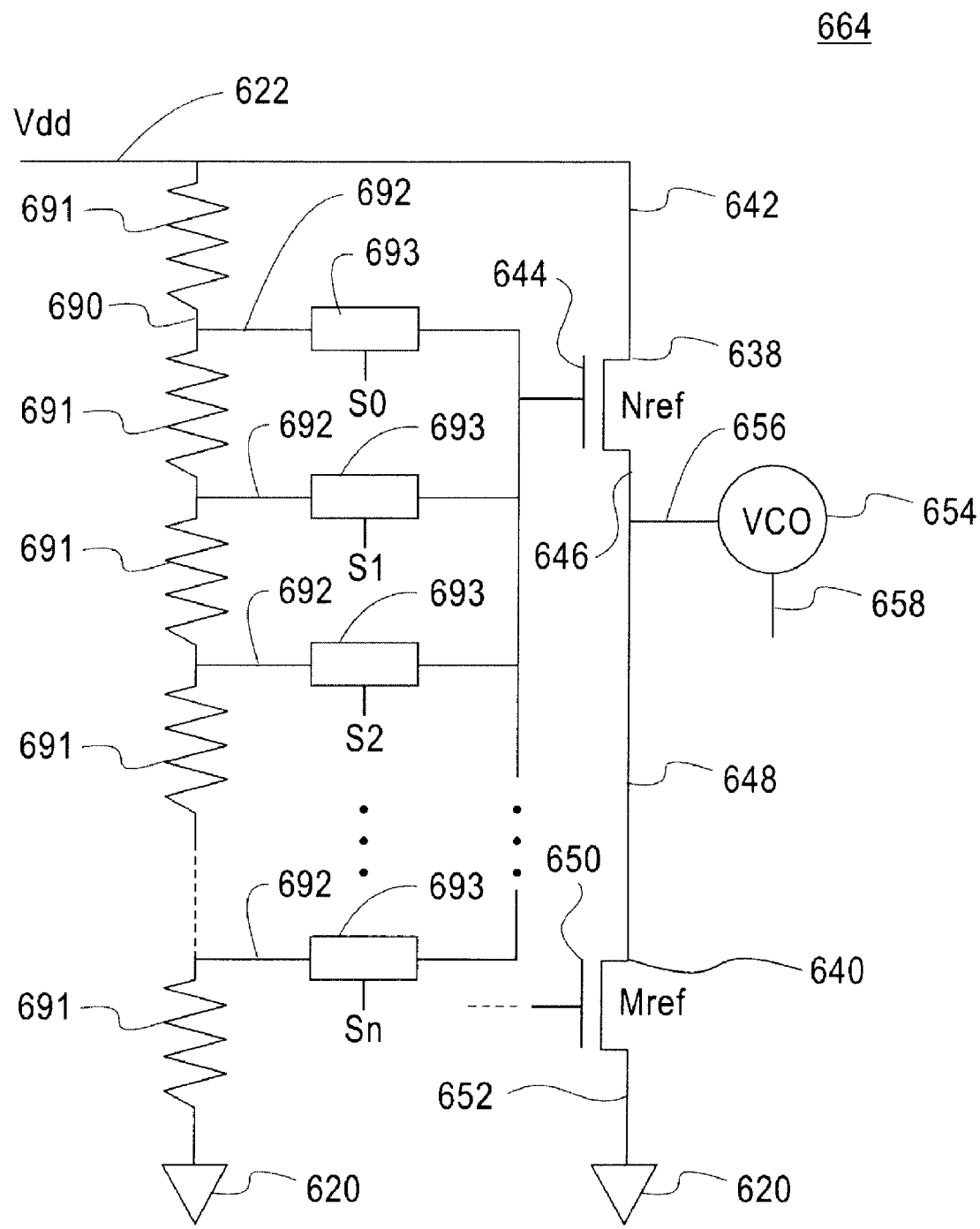
FIG. 6 shows an exemplary embodiment of an inventive calibrator with NFETs.

The calibrator 164 converts the measured variation of voltage Vout into a threshold voltage variation. Simulations show that in one or more exemplary embodiments, not to be taken as limiting, Vout variations equal approximately 0.8 of threshold variations, but the calibrator 164 makes it possible to measure this relationship with on-chip circuits. One possible implementation 664 of calibrator 164 is shown in FIG. 6. The calibrator 664 comprises a resistive divider, with various taps 692 connected to transmission gates 693, S0 to Sn. As the transmission gates 693 are selected singly, under control of the state machine 124, the voltage applied to the gate 644 of Nref 638 is varied by the resistance ratios selected. Thus the frequency observed from the reference VCO is directly related to the applied gate voltage of Nref, and since FETs are controlled by (Vg-Vth), often called the gate overdrive voltage, this provides a calibration of frequency vs. Vth (threshold voltage). The calibrator 664 can be connected to any of the upper N devices. Note the dotted line to the gate 650 since that gate terminal might be connected to a variable voltage, as in FIG. 1, or to a fixed voltage, as in FIGS. 2, 4 and 5.

Thus, the calibrator 664 comprises a resistive divider 690 interconnected between the second biasing terminal 622 and the first biasing terminal 620, with the resistive divider 690 having a plurality of taps 692. A plurality of switches (for example, transmission gates) 693 (S0 through Sn) selectively interconnect corresponding ones of the taps 692 to the gate 644 of the first fixed reference FET 638. Resistive divider 690 includes resistive segments 691, chosen for desired voltage take-off points. Elements 642, 646, 640, 648, 652, 654, 656, 658 are analogous to elements 142, 146, 140, 148, 152, 154, 156, 158 described above.

Since the devices are all typically very small, very little current will flow through the devices under test, and hence, voltage differences due to IR drops in the interconnects will be very small. Dense arrays of devices can be designed without much concern for very low resistance wiring. The measurement time in one or more inventive embodiments can be very short. For example, a 12-bit counter is required to achieve better than 0.1% voltage uncertainty. If a VCO is running at a few GHz, and is divided by 4, the time to count up to most of the bits of the counter will be about 45 μs. Scanning out the contents of the counter can take less than 1 μs. Thus, not including changing the state in the state machine, measurement of 10,000 devices will take only 50 ms. The resolution of the measurement is a function of the number of bits in the counter, the central frequency of the VCO, and the gain of the VCO. For example, if the VCO runs at 3 GHz, has a gain of 2 MHz/mV, and a 12 bit counter is used, the least significant digit of the counter corresponds to a change of 1.5 MHz, or a voltage change of 0.75 mV. Practical considerations will require more than a 1 bit count, but a resolution of 10 mV or better is easily achieved. The foregoing discussion is intended as an example, and should not be taken as limiting.

Figure 7:
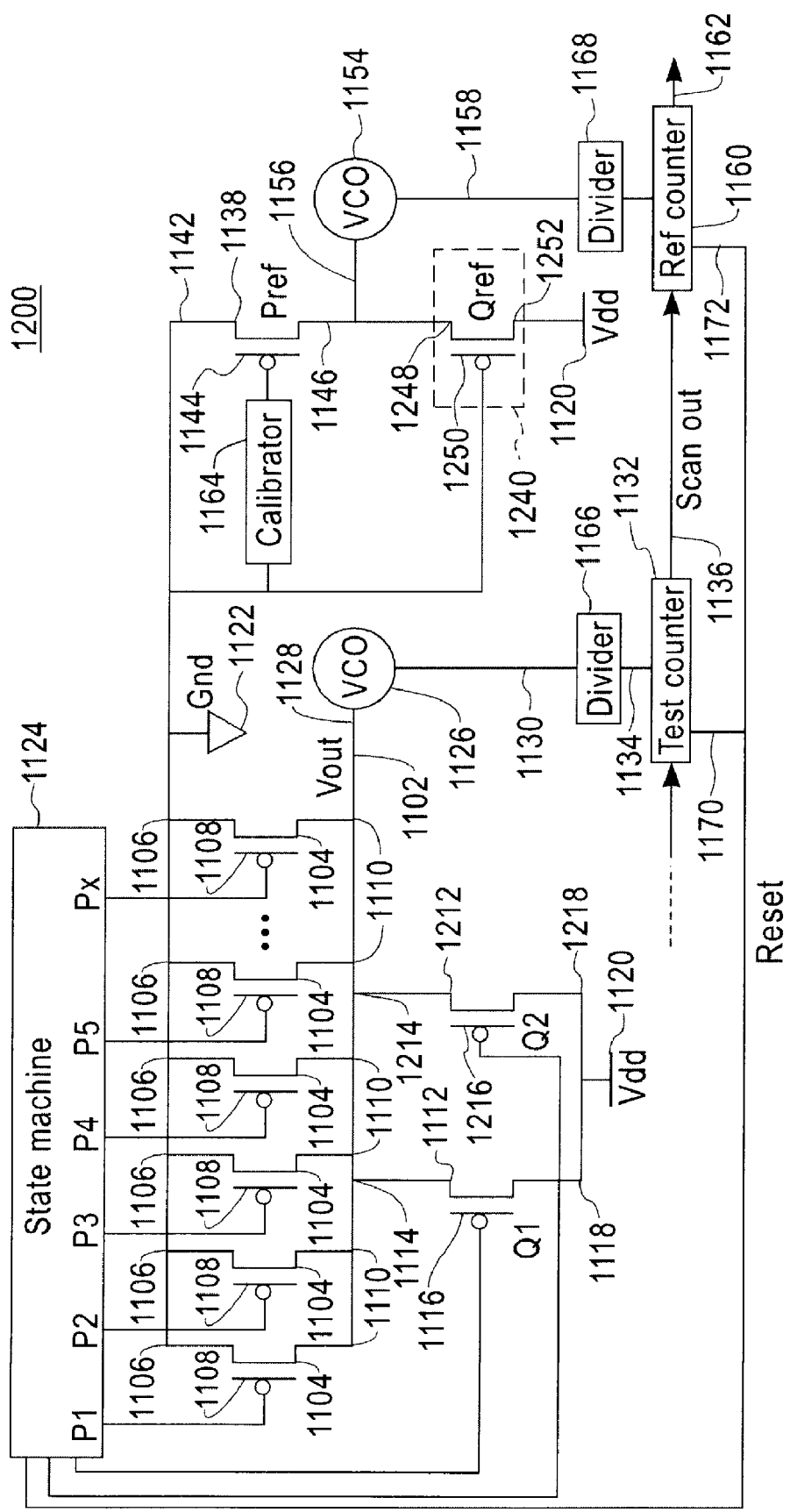
FIG. 7 shows an exemplary embodiment of a circuit according to yet a further aspect of the invention.
Figure 8:
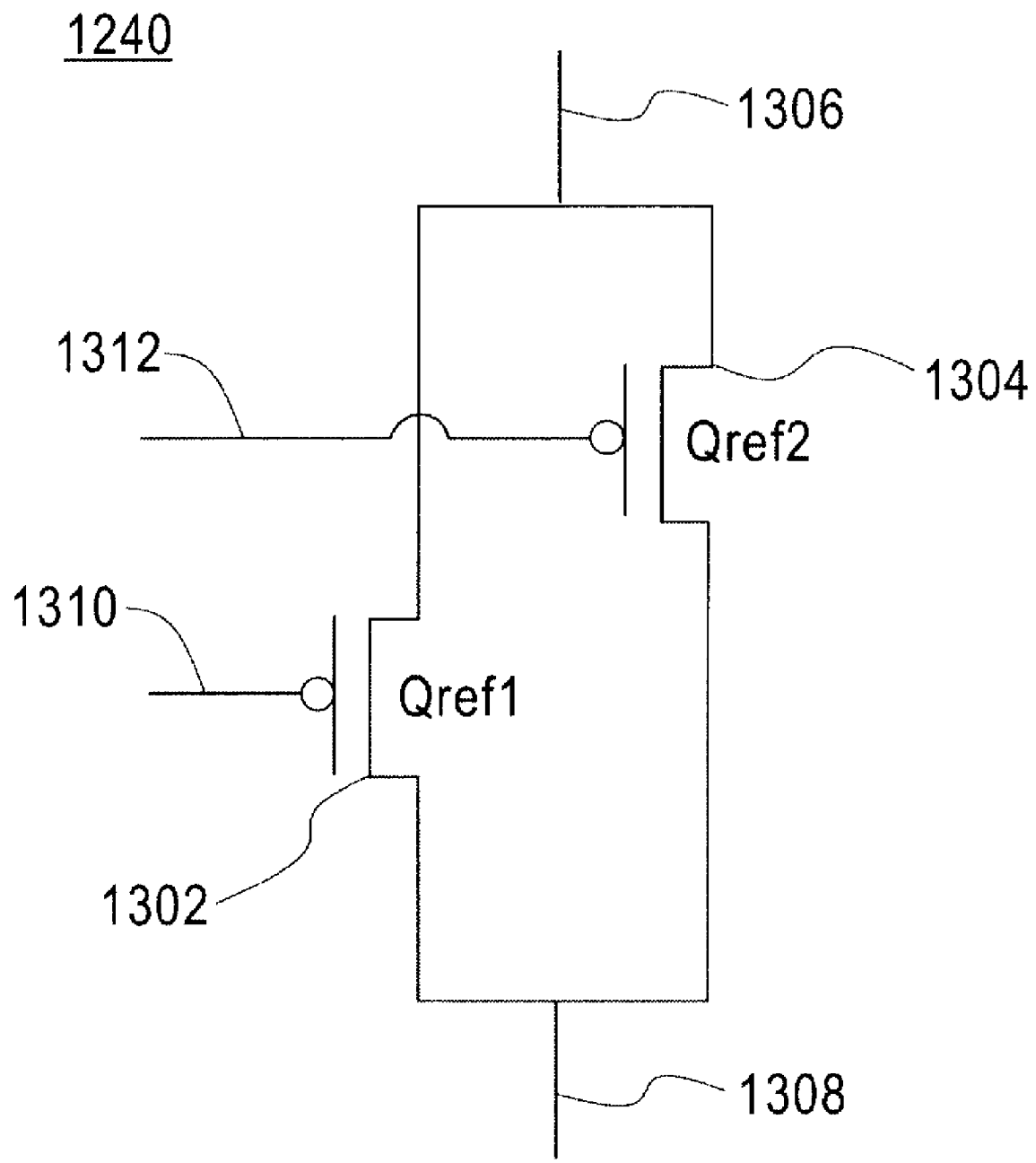
FIG. 8 shows an inventive block with reference p-type FETs (PFETs)
Figure 9:
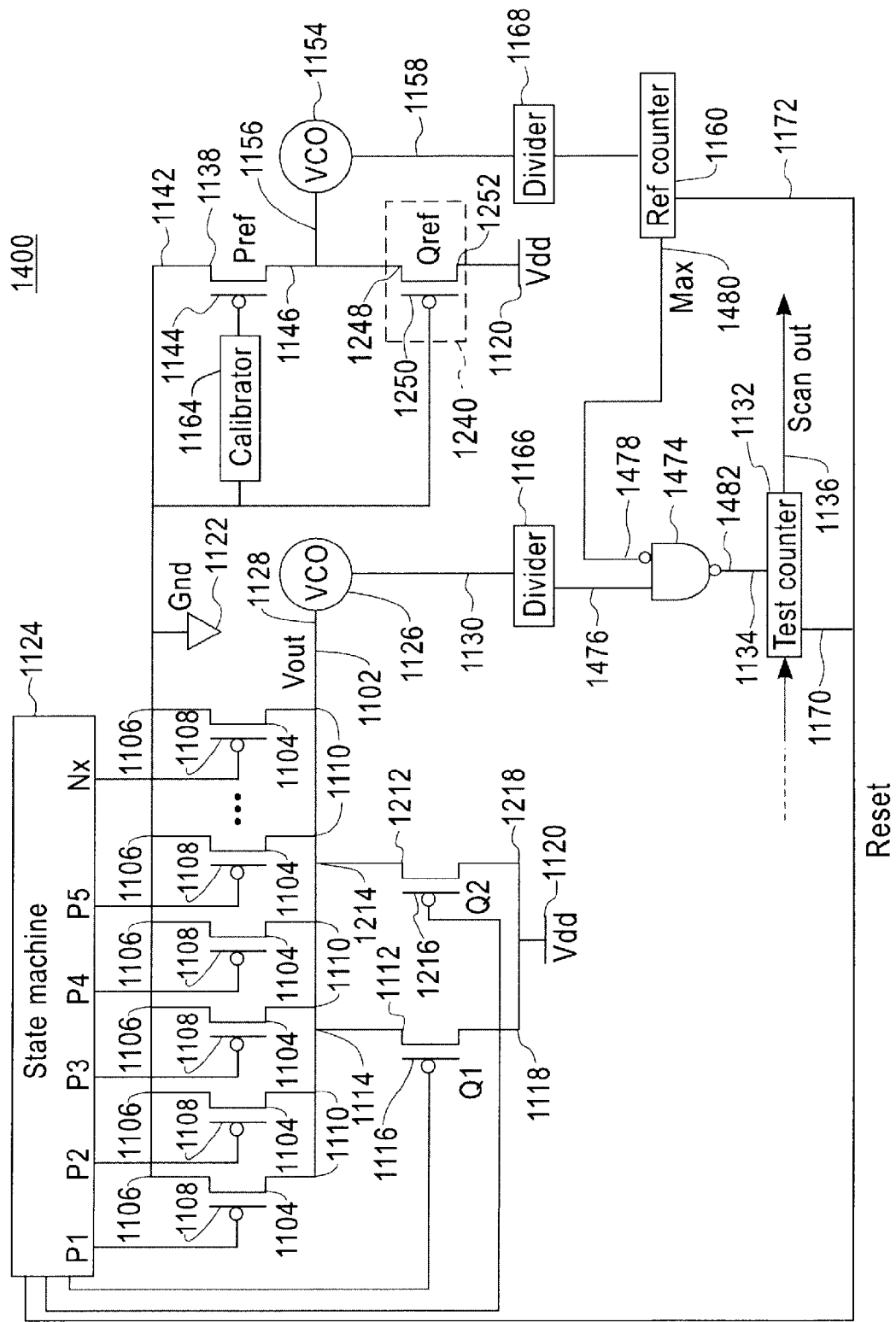
FIG. 9 shows an exemplary embodiment of a circuit according to still a further aspect of the invention.
Figure 10:
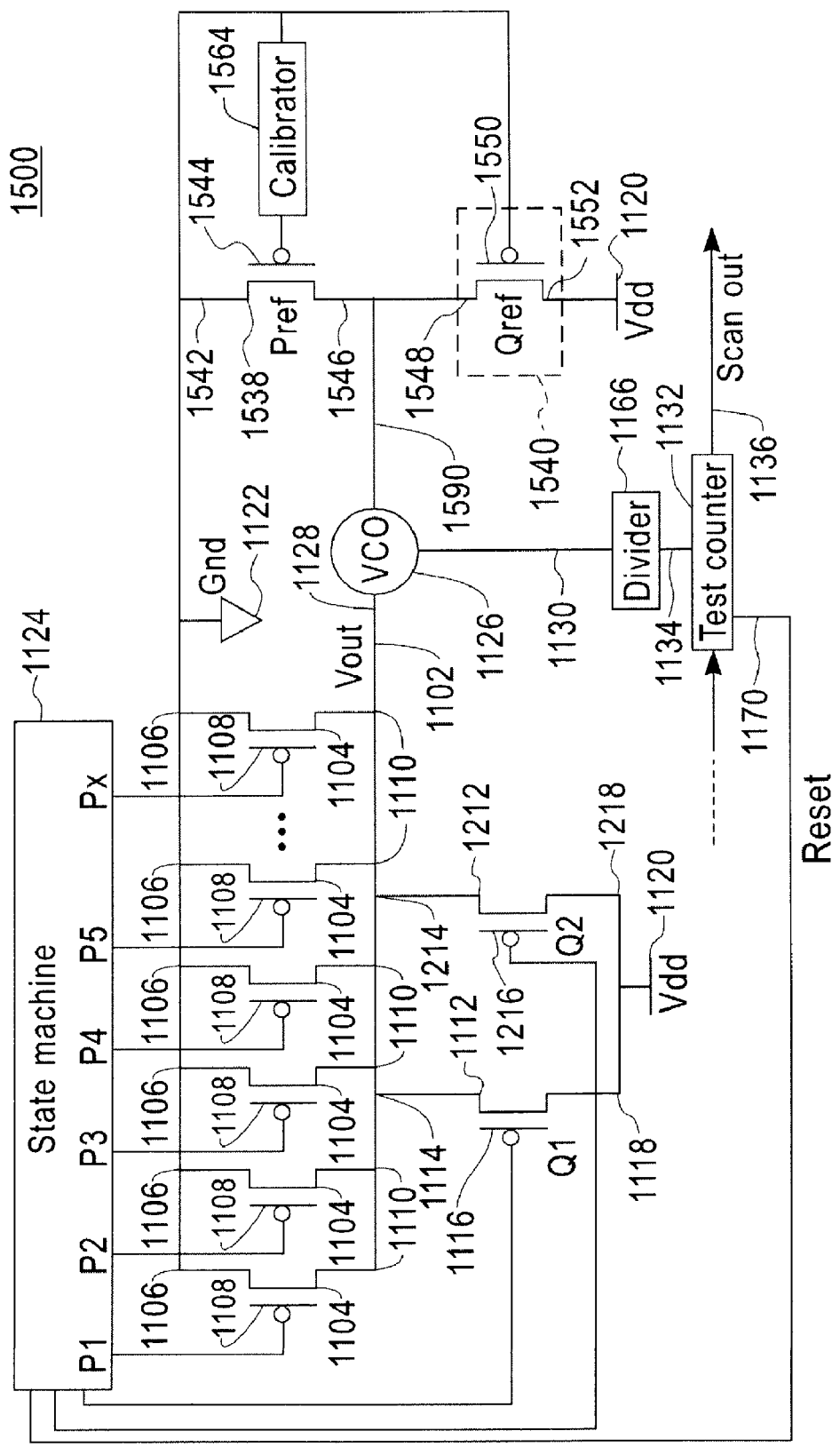
FIG. 10 shows an exemplary embodiment of a circuit according to an additional aspect of the invention.
Figure 11:
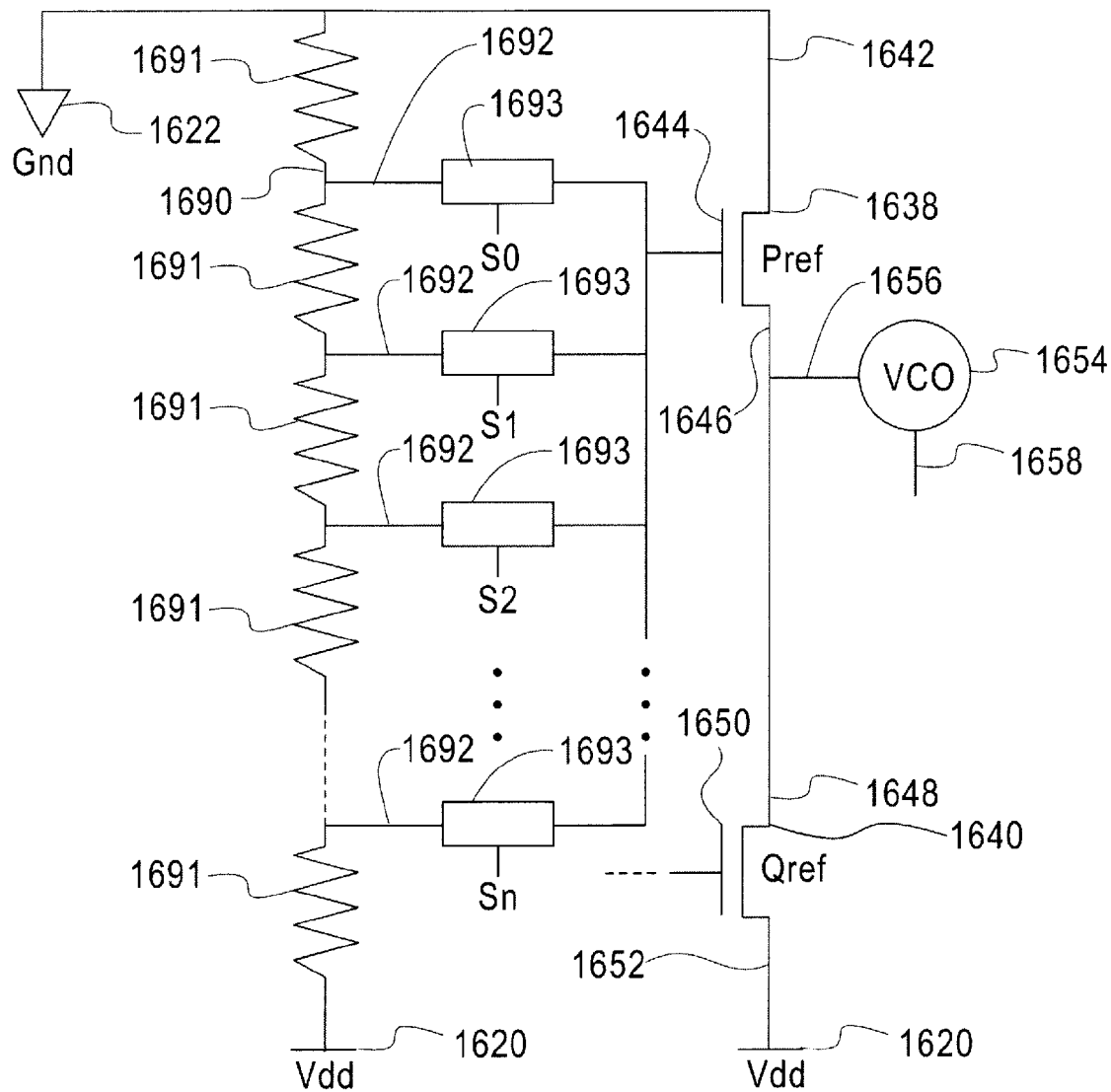
FIG. 11 shows an exemplary embodiment of an inventive calibrator with PFETs.

In the examples presented thus far, the plurality of FETS 104 to be tested and the at least first measuring FET 112 are NFETs, the first biasing terminal 120 comprises a ground terminal, and the second biasing terminal 122 comprises a voltage supply terminal. However, the skilled artisan will appreciate that any of the circuits described can be adapted to work with PFETs, by changing the polarities and the functioning of the drains and sources. Thus, the plurality of FETS to be tested could be PFETs P1 through Px and the measuring FET(s) could comprise PFETs. In this case, the first biasing terminal comprises a voltage supply terminal and the second biasing terminal 122 comprises a ground terminal. FIG. 7 shows a PFET version of FIG. 2, FIG. 8 shows a PFET version of FIG. 3, FIG. 9 shows a PFET version of FIG. 4, FIG. 10 shows a PFET version of FIG. 5, and FIG. 11 shows a PFET version of FIG. 6. Elements in FIGS. 7-11 similar to those in FIGS. 2-6 have received the same reference character incremented by one thousand and function in an analogous fashion. Further, NFETs designated as N or M have corresponding PFETS designated as P or Q, respectively, in the PFET figures. The skilled artisan will appreciate how to make a PFET version of FIG. 1, by changing polarities and device types, given the teachings herein.

At least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the circuits described herein, and may include other structures or circuits. The individual die are cut or diced from the wafer, then packaged as an integrated circuit. A person of skill in the art will know how to dice wafers and package die to produce integrated circuits. Integrated circuits so manufactured are considered part of the present invention. Circuits including cells as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope of spirit of the invention.

What is claimed is:

1. A method for operating an electronic circuit, said method comprising the steps of:
   providing an electronic circuit comprising:
      an output terminal;
      a plurality of field effect transistors to be tested, said field effect transistors having first drain-source terminals, gates, and second drain-source terminals;
      at least a first measuring field effect transistor having a first drain-source terminal, a gate, and a second drain-source terminal, said second drain-source terminals of said plurality of field effect transistors to be tested being interconnected with said first drain-source terminal of said first measuring field effect transistor and said output terminal;
      a first biasing terminal, said second drain-source terminal of said first measuring field effect transistor being interconnected with said first biasing terminal;

a second biasing terminal, said first drain-source terminals of said field effect transistors to be tested being interconnected with said second biasing terminal;

a state machine coupled to said gates of said field effect transistors to be tested and said gate of said first measuring field effect transistor, said state machine being configured to energize said gate of said first measuring field effect transistor and to sequentially energize said gates of said field effect transistors to be tested, whereby an output voltage appears on said output terminal;

circuitry to compare said output voltage to a reference value; and a second measuring field effect transistor having a first drain-source terminal, a gate, and a second drain-source terminal, said first drain-source terminal of said second measuring field effect transistor being interconnected with said first drain-source terminal of said first measuring field effect transistor, said second drain-source terminal of said second measuring field effect transistor being interconnected with said first biasing terminal, said gate of said second measuring field effect transistor being interconnected with said state machine, said first and second measuring field effect transistors each having a width, said widths being selected so as to operate a given one of said field effect transistors to be tested at a measuring point wherein said given one of said field effect transistors is operating, at a given time, in a desired one of a linear region and a saturation region;

energizing said gate of said first measuring field effect transistor;

sequentially energizing said gates of said field effect transistors to be tested, whereby said output voltage appears on said output terminal; and comparing said output voltage to said reference value.

2. A method for operating an electronic circuit, said method comprising the steps of:

providing an electronic circuit comprising:

an output terminal;

a plurality of field effect transistors to be tested, said field effect transistors having first drain-source terminals, gates, and second drain-source terminals;

at least a first measuring field effect transistor having a first drain-source terminal, a gate, and a second drain-source terminal, said second drain-source terminals of said plurality of field effect transistors to be tested being interconnected with said first drain-source terminal of said first measuring field effect transistor and said output terminal;

a first biasing terminal, said second drain-source terminal of said first measuring field effect transistor being interconnected with said first biasing terminal;

a second biasing terminal, said first drain-source terminals of said field effect transistors to be tested being interconnected with said second biasing terminal;

a state machine coupled to said gates of said field effect transistors to be tested and said gate of said first measuring field effect transistor, said state machine being configured to energize said gate of said first measuring field effect transistor and to sequentially energize said gates of said field effect transistors to be tested, whereby an output voltage appears on said output terminal; and circuitry to compare said output voltage to a reference value;

wherein:

said circuitry to compare said output voltage to a reference value comprises:

a voltage controlled oscillator, said voltage controlled oscillator having a control terminal interconnected with said output terminal, said voltage controlled oscillator having an output; and a test counter, said test counter having an input terminal coupled to said output of said voltage controlled oscillator, said test counter having an output terminal;

said state machine is configured to supply a variable gate voltage to said first measuring field effect transistor, so as to operate a given one of said field effect transistors to be tested at a measuring point wherein said given one of said field effect transistors is operating, at a given time, in a desired one of a linear region and a saturation region;

said voltage controlled oscillator comprises a first voltage controlled oscillator; and said circuitry to compare said output voltage to said reference value further comprises:

first and second fixed reference field effect transistors, each having a first drain-source terminal, a gate, and a second drain-source terminal, said second drain-source terminal of said first fixed reference field effect transistor being connected to said first drain-source terminal of said second fixed reference field effect transistor, said gate of said first fixed reference field effect transistor being coupled to said second biasing terminal, said gate of said second fixed reference field effect transistor being coupled to said gate of said first measuring field effect transistor, said first drain-source terminal of said first fixed reference field effect transistor being coupled to said second biasing terminal, said second drain-source terminal of said second fixed reference field effect transistor being coupled to said first biasing terminal;

a second voltage controlled oscillator, said second voltage controlled oscillator having a control terminal interconnected with said second drain-source terminal of said first fixed reference field effect transistor and said first drain-source terminal of said second fixed reference field effect transistor, said second voltage controlled oscillator having an output; and a reference counter coupled to said output of said second voltage controlled oscillator, said reference counter having an output terminal;

energizing said gate of said first measuring field effect transistor, by supplying said variable gate voltage to said first measuring field effect transistor, so as to operate said given one of said field effect transistors to be tested at said measuring point wherein said given one of said field effect transistors is operating, at said given time, in said desired one of said linear region and said saturation region;

sequentially energizing said gates of said field effect transistors to be tested, whereby said output voltage appears on said output terminal; and comparing said output voltage to said reference value.

3. A method for operating an electronic circuit, said method comprising the steps of:
   providing an electronic circuit comprising:
      an output terminal;
      a plurality of field effect transistors to be tested, said field effect transistors having first drain-source terminals, gates, and second drain-source terminals;
      at least a first measuring field effect transistor having a first drain-source terminal, a gate, and a second drain-source terminal, said second drain-source terminals of said plurality of field effect transistors to be tested being interconnected with said first drain-source terminal of said first measuring field effect transistor and said output terminal;
      a first biasing terminal, said second drain-source terminal of said first measuring field effect transistor being interconnected with said first biasing terminal;
      a second biasing terminal, said first drain-source terminals of said field effect transistors to be tested being interconnected with said second biasing terminal;
      a state machine coupled to said gates of said field effect transistors to be tested and said gate of said first measuring field effect transistor, said state machine being configured to energize said gate of said first measuring field effect transistor and to sequentially energize said gates of said field effect transistors to be tested, whereby an output voltage appears on said output terminal;
      circuitry to compare said output voltage to a reference value; and
      a second measuring field effect transistor having a first drain-source terminal, a gate, and a second drain-source terminal, said first drain-source terminal of said second measuring field effect transistor being interconnected with said first drain-source terminal of said first measuring field effect transistor, said second drain-source terminal of said second measuring field effect transistor being interconnected with said first biasing terminal, said gate of said second measuring field effect transistor being interconnected with said state machine, said first and second measuring field effect transistors each having a width, said widths being selected so as to operate a given one of said field effect transistors to be tested at a measuring point wherein said given one of said field effect transistors is operating, at a given time, in a desired one of a linear region and a saturation region;
   wherein:
      said circuitry to compare said output voltage to a reference value comprises:
         a voltage controlled oscillator, said voltage controlled oscillator having a control terminal interconnected with said output terminal, said voltage controlled oscillator having an output; and
         a test counter, said test counter having an input terminal coupled to said output of said voltage controlled oscillator, said test counter having an output terminal;
      said voltage controlled oscillator comprises a first voltage controlled oscillator; and
      said circuitry to compare said output voltage to said reference value further comprises:
         a first fixed reference field effect transistor, having a first drain-source terminal, a gate, and a second drain-source terminal, and a second fixed reference field effect transistor block, having a first drain-source terminal, a gate terminal, and a second drain-source terminal, said second drain-source terminal of said first fixed reference field effect transistor being connected to said first drain-source terminal of said second fixed reference field effect transistor block, said gate of said first fixed reference field effect transistor and said gate terminal of said second fixed reference field effect transistor block being coupled to said second biasing terminal, said first drain-source terminal of said first fixed reference field effect transistor being coupled to said second biasing terminal, said second drain-source terminal of said second fixed reference field effect transistor block being coupled to said first biasing terminal;
         a second voltage controlled oscillator, said second voltage controlled oscillator having a control terminal interconnected with said second drain-source terminal of said first fixed reference field effect transistor and said first drain-source terminal of said second fixed reference field effect transistor block, said second voltage controlled oscillator having an output; and
         a reference counter coupled to said output of said second voltage controlled oscillator, said reference counter having an output terminal;
   energizing said gate of said first measuring field effect transistor;
   sequentially energizing said gates of said field effect transistors to be tested, whereby said output voltage appears on said output terminal; and
   comparing said output voltage to said reference value.

4. The method of claim 3, wherein, in said step of providing said circuit, said circuit further comprises a calibrator, and wherein said gate of said first fixed reference field effect transistor is coupled to said second biasing terminal through said calibrator.

5. The method of claim 4, wherein said calibrator of said circuit provided in said step of providing said circuit comprises:
   a resistive divider interconnected between said second biasing terminal and said first biasing terminal, said resistive divider having a plurality of taps; and
   a plurality of switches selectively interconnecting corresponding ones of said taps to said gate of said first fixed reference field effect transistor.

6. The method of claim 3, wherein, in said step of providing said circuit, said circuit further comprises first and second dividers, wherein said output of said first voltage controlled oscillator is connected to said test counter through said first divider and said output of said second voltage controlled oscillator is connected to said reference counter through said second divider.

7. A method for operating an electronic circuit, said method comprising the steps of:
   providing an electronic circuit comprising:
      an output terminal;
      a plurality of field effect transistors to be tested, said field effect transistors having first drain-source terminals, gates, and second drain-source terminals;
      at least a first measuring field effect transistor having a first drain-source terminal, a gate, and a second drain-source terminal, said second drain-source terminals of said plurality of field effect transistors to be tested being interconnected with said first drain-source terminal of said first measuring field effect transistor and said output terminal;
      a first biasing terminal, said second drain-source terminal of said first measuring field effect transistor being interconnected with said first biasing terminal;

a second biasing terminal, said first drain-source terminals of said field effect transistors to be tested being interconnected with said second biasing terminal;

a state machine coupled to said gates of said field effect transistors to be tested and said gate of said first measuring field effect transistor, said state machine being configured to energize said gate of said first measuring field effect transistor and to sequentially energize said gates of said field effect transistors to be tested, whereby an output voltage appears on said output terminal;

circuitry to compare said output voltage to a reference value; and a second measuring field effect transistor having a first drain-source terminal, a gate, and a second drain-source terminal, said first drain-source terminal of said second measuring field effect transistor being interconnected with said first drain-source terminal of said first measuring field effect transistor, said second drain-source terminal of said second measuring field effect transistor being interconnected with said first biasing terminal, said gate of said second measuring field effect transistor being interconnected with said state machine, said first and second measuring field effect transistors each having a width, said widths being selected so as to operate a given one of said field effect transistors to be tested at a measuring point wherein said given one of said field effect transistors is operating, at a given time, in a desired one of a linear region and a saturation region;

wherein:

said circuitry to compare said output voltage to a reference value comprises:

a voltage controlled oscillator, said voltage controlled oscillator having a control terminal interconnected with said output terminal, said voltage controlled oscillator having an output; and a test counter, said test counter having an input terminal coupled to said output of said voltage controlled oscillator, said test counter having an output terminal;

said voltage controlled oscillator comprises a first voltage controlled oscillator; and said circuitry to compare said output voltage to said reference value further comprises:

a first fixed reference field effect transistor, having a first drain-source terminal, a gate, and a second drain-source terminal, and a second fixed reference field effect transistor block, having a first drain-source terminal, a gate terminal, and a second drain-source terminal, said second drain-source terminal of said first fixed reference field effect transistor being connected to said first drain-source terminal of said second fixed reference field effect transistor block, said gate of said first fixed reference field effect transistor and said gate terminal of said second fixed reference field effect transistor block being coupled to said second biasing terminal, said first drain-source terminal of said first fixed reference field effect transistor being coupled to said second biasing terminal, said second drain-source terminal of said second fixed reference field effect transistor block being coupled to said first biasing terminal;

a second voltage controlled oscillator, said second voltage controlled oscillator having a control terminal interconnected with said second drain-source terminal of said first fixed reference field effect transistor and said first drain-source terminal of said second fixed reference field effect transistor block, said second voltage controlled oscillator having an output;

a reference counter coupled to said output of said second voltage controlled oscillator, said reference counter having a max output outputting a predetermined logic level upon said reference counter reaching a maximum count; and a logic gate having a first input coupled to said output of said first voltage controlled oscillator and a second input coupled to said max output of said reference counter, said logic gate having an output coupled to said input of said test counter, said logic gate being configured to enable said test counter until said reference counter reaches said maximum count;

energizing said gate of said first measuring field effect transistor;

sequentially energizing said gates of said field effect transistors to be tested, whereby said output voltage appears on said output terminal; and comparing said output voltage to said reference value, said comparing including enabling said test counter until said reference counter reaches said maximum count.

8. The method of claim 7, wherein, in said step of providing said circuit, said circuit further comprises a calibrator, and wherein said gate of said first fixed reference field effect transistor is coupled to said second biasing terminal through said calibrator.

9. The method of claim 8, wherein said calibrator of said circuit provided in said step of providing said circuit comprises:

a resistive divider interconnected between said second biasing terminal and said first biasing terminal, said resistive divider having a plurality of taps; and a plurality of switches selectively interconnecting corresponding ones of said taps to said gate of said first fixed reference field effect transistor.

10. The method of claim 7, wherein, in said step of providing said circuit, said circuit further comprises first and second dividers, and wherein said output of said first voltage controlled oscillator is connected to said first input of said logic gate through said first divider and said output of said second voltage controlled oscillator is connected to said reference counter through said second divider.

11. A method for operating an electronic circuit, said method comprising the steps of:

providing an electronic circuit comprising:

an output terminal;

a plurality of field effect transistors to be tested, said field effect transistors having first drain-source terminals, gates, and second drain-source terminals;

at least a first measuring field effect transistor having a first drain-source terminal, a gate, and a second drain-source terminal, said second drain-source terminals of said plurality of field effect transistors to be tested being interconnected with said first drain-source terminal of said first measuring field effect transistor and said output terminal;

a first biasing terminal, said second drain-source terminal of said first measuring field effect transistor being interconnected with said first biasing terminal;

a second biasing terminal, said first drain-source terminals of said field effect transistors to be tested being interconnected with said second biasing terminal;

a state machine coupled to said gates of said field effect transistors to be tested and said gate of said first measuring field effect transistor, said state machine being configured to energize said gate of said first measuring field effect transistor and to sequentially energize said gates of said field effect transistors to be tested, whereby an output voltage appears on said output terminal;

circuitry to compare said output voltage to a reference value; and a second measuring field effect transistor having a first drain-source terminal, a gate, and a second drain-source terminal, said first drain-source terminal of said second measuring field effect transistor being interconnected with said first drain-source terminal of said first measuring field effect transistor, said second drain-source terminal of said second measuring field effect transistor being interconnected with said first biasing terminal, said gate of said second measuring field effect transistor being interconnected with said state machine, said first and second measuring field effect transistors each having a width, said widths being selected so as to operate a given one of said field effect transistors to be tested at a measuring point wherein said given one of said field effect transistors is operating, at a given time, in a desired one of a linear region and a saturation region;

wherein:

said circuitry to compare said output voltage to a reference value comprises:

a voltage controlled oscillator, said voltage controlled oscillator having a control terminal interconnected with said output terminal, said voltage controlled oscillator having an output; and a test counter, said test counter having an input terminal coupled to said output of said voltage controlled oscillator, said test counter having an output terminal;

said voltage controlled oscillator comprises a differential voltage controlled oscillator;

said control terminal of said voltage controlled oscillator comprises a first differential control terminal, said voltage controlled oscillator further comprising a second differential control terminal; and said circuitry to compare said output voltage to said reference value further comprises:

a first fixed reference field effect transistor, having a first drain-source terminal, a gate, and a second drain-source terminal, and a second fixed reference field effect transistor block, having a first drain-source terminal, a gate terminal, and a second drain-source terminal, said second drain-source terminal of said first fixed reference field effect transistor being connected to said first drain-source terminal of said second fixed reference field effect transistor block, said gate of said first fixed reference field effect transistor and said gate terminal of said second fixed reference field effect transistor block being coupled to said second biasing terminal, said first drain-source terminal of said first fixed reference field effect transistor being coupled to said second biasing terminal, said second drain-source terminal of said second fixed reference field effect transistor block being coupled to said first biasing terminal; and energizing said gate of said first measuring field effect transistor;

sequentially energizing said gates of said field effect transistors to be tested, whereby said output voltage appears on said output terminal; and comparing said output voltage to said reference value.

12. The method of claim 11, wherein, in said step of providing said circuit, said circuit further comprises a calibrator, wherein said gate of said first fixed reference field effect transistor is coupled to said second biasing terminal through said calibrator.

13. The method of claim 12, said calibrator of said circuit provided in said step of providing said circuit comprises:

a resistive divider interconnected between said second biasing terminal and said first biasing terminal, said resistive divider having a plurality of taps; and a plurality of switches selectively interconnecting corresponding ones of said taps to said gate of said first fixed reference field effect transistor.

14. The method of claim 11, wherein said calibrator of said circuit provided in said step of providing said circuit further comprises a divider, and wherein said output of said voltage controlled oscillator is connected to said test counter through said divider.

* * * * *